United States Patent [19]

Shibata et al.

[11] 4,267,011
[45] May 12, 1981

[54] METHOD FOR MANUFACTURING A SEMICONDUCTOR DEVICE

[75] Inventors: Tadashi Shibata, Menlo Park, Calif.; Hisakazu Iizuka, Yokohama, Japan

[73] Assignee: Tokyo Shibaura Denki Kabushiki Kaisha, Kawasaki, Japan

[21] Appl. No.: 77,272

[22] Filed: Sep. 20, 1979

[30] Foreign Application Priority Data

Sep. 29, 1978 [JP] Japan .................. 53-119211
Sep. 29, 1978 [JP] Japan .................. 53-119212
Sep. 29, 1978 [JP] Japan .................. 53-119213

[51] Int. Cl.³ .............. H01L 21/306; B44C 1/22; C03C 15/00; C03C 25/06
[52] U.S. Cl. .................. 156/628; 29/571; 148/187; 156/643; 156/657
[58] Field of Search .......... 156/628, 643, 653, 657, 156/659.1, 661.1, 662; 148/1.5, 187; 219/121 EB, 121 EM, 121 L, 121 LM; 29/571; 427/85-91

[56] References Cited
U.S. PATENT DOCUMENTS
3,615,935 10/1971 O'Keeffe .................. 156/643 X FOREIGN PATENT DOCUMENTS
2723933 6/1978 Fed. Rep. of Germany .......... 156/643
54-4826 3/1979 Japan .

OTHER PUBLICATIONS

Science, vol. 201, Laser Annealing: Processing Semiconductors without a Furnace by A. L. Robinson, Jul. 29, 1978, pp. 333-335.

Primary Examiner—William A. Powell
Attorney, Agent, or Firm—Oblon, Fisher, Spivak, McClelland & Maier

[57] ABSTRACT

Disclosed is a method for manufacturing a semiconductor device using a polycrystalline silicon layer as an electrode and/or wire which includes a process for applying a laser light or electron beam to the polycrystalline silicon layer prior to a patterning process, thereby preventing over-etching and diffusion of impurity into the surface of a semiconductor substrate which are liable to be caused in the manufacturing processes, facilitating patterning in a desired manner, and reducing the resistance of the polycrystalline silicon layer to improve the operating speed of the device.

6 Claims, 18 Drawing Figures

METHOD FOR MANUFACTURING A SEMICONDUCTOR DEVICE

BACKGROUND OF THE INVENTION

This invention relates to a method for manufacturing an LSI (large scale integration) semiconductor device using a polycrystalline silicon layer as an electrode and/or wire.

Especially for large scale integration of an MOS (metal oxide semiconductor) type field-effect transistor (FET), there is known as an advanced technique the silicon gate technology employing a polycrystalline silicon layer as a gate electrode and forming source and drain regions in the self-alignment system.

Such silicon gate technology, however, still involves too many problems to achieve further improved LSI.

Referring now to the drawings of FIGS. 1a to 1e, there will be described the aforesaid problems in connection with a method for manufacturing an LSI n-channel MOS FET, by way of example. As shown in FIG. 1a, a silicon oxide ($SiO_2$) film 2 with a thickness of approximately 1 μm is formed by selectively oxidizing the surface of a p-type silicon substrate 1, thereby isolating elements from one another. Then, as shown in FIG. 1b, an $SiO_2$ film 3 as thin as about 700 Å to serve as a gate oxide film is formed by oxidizing part of the surface of the substrate 1 which is not covered with the $SiO_2$ film 2, and a polycrystalline silicon layer 4 with a thickness of about 3,000 Å is formed over the whole surface of the $SiO_2$ film 3.

As shown in FIG. 1b, phosphorus from e.g. $POCl_3$ as a diffusion source is diffused into the whole surface of the polycrystalline silicon layer 4 at approximately 1,000° C. for about 10 minutes. A polycrystalline silicon layer 4' subjected to such diffusion, having a relatively low resistance, can be used as a gate electrode.

A photo-resist film 5 is formed selectively on the polycrystalline silicon layer 4' doped with the impurity, as shown in FIG. 1c, the polycrystalline silicon layer 4' is plasma-etched for patterning by using e.g. freon plasma, and part of the polycrystalline silicon layer 4' is left to form a gate electrode.

Subsequently, as shown in FIG. 1d, n-type source and drain regions 6 and 7 are formed by removing portions of the 700 Å $SiO_2$ film 3 to form the source and drain regions, also removing the photo-resist film 5, implanting e.g. 150 kev As ion at a rate of $1 \times 10^{16}/cm^2$, and annealing the resultant structure in an $N_2$ atmosphere at approximately 1,000° C. for about one hour.

Then, as shown in FIG. 1e, a relatively thick or e.g. about 1 μm $SiO_2$ film 8 is formed all over the surface by the gaseous growth method, contact holes for electrical contact are bored in the $SiO_2$ film 8, an aluminium layer 9 is formed selectively, an oxide film doped with e.g. phosphorus or PSG film 10 is formed on the Al layer 9, and finally an electrode opening 10a is bored in the PSG film 10.

In the above-mentioned method for manufacturing the MOS FET, the polycrystalline silicon layer 4' used as the gate electrode is a gathering of a great number of small crystalline regions called grains. At the boundaries among these grains, however, there may be caused what is called impurity penetration such that impurity such as phosphorus is diffused abnormally fast at the boundaries among the grains to reach the Si substrates 1 through the about 700 Å gate oxide film 3. Moreover, those boundary portions are poor in the masking capability against ion implantation, so that As ion may often be partially implanted in the Si substrate 1 though thin $SiO_2$ layer 3 in the formation of the source and drain regions 6 and 7 by the ion implantation method as shown in FIG. 1d. Thus, if the impurity with which the polycrystalline silicon layer 4' or the source and drain regions 6 and 7 are doped is introduced into the Si substrate 1 under the gate electrode, the normal operation of the transistor will be impeded.

Further, since the polycrystalline silicon layer 4' used as the gate electrode is a gathering of a great number of small crystalline regions called grains, as described above, exhibiting different crystalline characteristics and uneven impurity distribution, so the etching would often proceed at an extraordinarily high speed along the boundaries among the grains. If such effect is caused, the periphery of the polycrystalline silicon layer 4' to form the gate electorde will possibly be jagged or partially notched. In consequence, the width of the polycrystalline silicon layer 4' partially narrowed to cause a short circuit between the source and drain regions 6 and 7, which will interrupt the operation of the transistor. This phenomenon becomes more distinguished as the width of the polycrystalline silicon layer 4' is reduced accompanying the large scale integration of semiconductor devices.

The resistance value of the polycrystalline silicon layer 4' to form the electrode, manufactured by the above-mentioned prior art method, is approximately 20Ω/□. Although this resistance value may be decreased as the impurity (phosphorus) difusion time increases, it will not be reduced below approximately 20Ω/□. This is attributable to a fact that the concentration of phosphorus in the polycrystalline silicon layer cannot exceed the solid solubility. If the thickness of the polycrystalline silicon layer is, for example, double (approx. 6,000 Å) in order to lower the resistance value, the resistance value will substantially be halved. The increase in the thickness of the layer will, however, make it hard to achieve accurate patterning, so that such operation cannot be used for a process for forming a fine pattern, in particular. When using the polycrystalline silicon layer as a wire to transmit signals in an LSI, on the other hand, it is necessary that the resistance value of the layer be reduced as low as possible to increase the operating speed of the device. The prior art method has not been able to fulfill these requirements.

SUMMARY OF THE INVENTION

The object of this invention is to provide a method for manufacturing a semiconductor device characterized by comprising the following processes.

That is, according to this invention, there is provided a method for manufacturing a semiconductor device which comprises a process for forming an insulating film at least on part of the surface of a semiconductor substrate, a process for forming a polycrystalline silicon layer on the insulating film, a process for forming an electrically conducting portion such as an electrode or a wire portion by patterning of the polycrystalline silicon layer, and a process for forming other insulating film covering at least the electrically conductive wire portion, the method characterized by further comprising a process for applying a laser light or electron beam at least to part of the polycrystalline silicon layer which is to be formed as said electrically conductive portion prior to the patterning process.

In the above-mentioned method according to this invention, the polycrystalline silicon layer forming the electrically conductive portion is patterned after the laser light or electron beam has been applied to at least a part of the polycrystalline silicon layer, and then at least a part of the polycrystalline silicon layer is doped with impurity. Instead, the patterning of the polycrystalline silicon layer may be carried out after the impurity doping has been conducted. Alternatively, the impurity doping may be first conducted, next the laser light or electron beam application, and finally the patterning of the polycrystalline silicon layer. The semiconductor substrate is made an n-type silicon, and the first, second and third insulating films are made of $SiO_2$. The polycrystalline silicon layer may be doped with phosphorus, arsenic or boron.

DETAILED DESCRIPTION OF THE PREFERRED EMBODIMENTS

Now there will be described a method for manufacturing an n-channel MOS FET according to an embodiment of this invention.

Figure 2A:
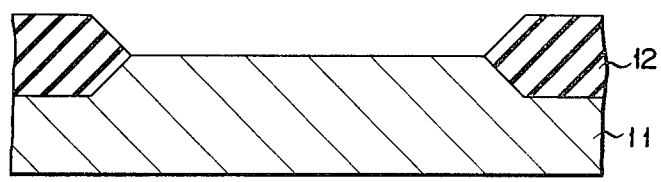
FIGS. 2a to 2f are sectional views for illustrating processes of a method for manufacturing an n-channel MOS FET according to an embodiment of this invention.
Figure 2B:
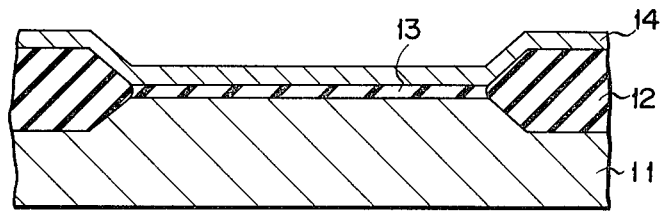
Figure 2C:
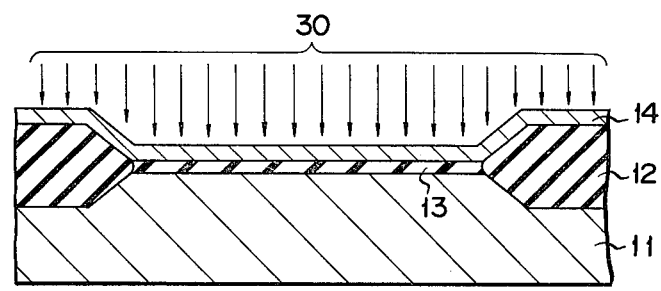
Figure 3:
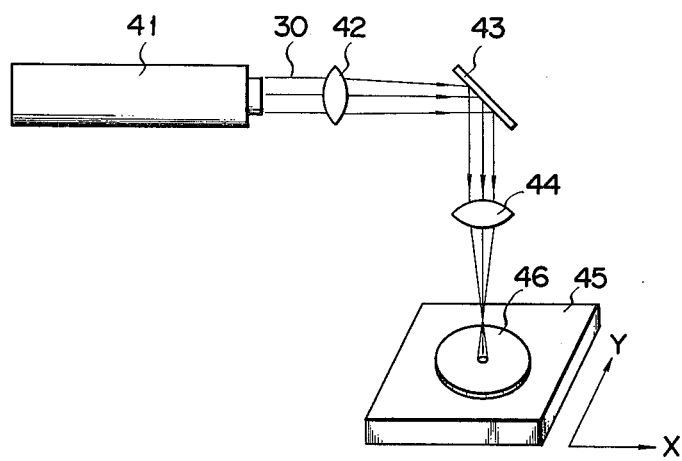
FIG. 3 is a perspective view showing an outline of a laser unit for the application of laser light used with the embodiment of the invention as shown in FIGS. 2a to 2f.

As shown in FIG. 2a, a first insulating film, e.g. a silicon oxide ($SiO_2$) film 12 with a thickness of approximately 1 μm, is formed be selectively oxidizing the surface of a p-type silicon substrate 11, thereby isolating elements from one another. Then, as shown in FIG. 2b, a second insulating film, e.g. an $SiO_2$ film 13 as thin as approximately 700 Å, to serve as a gate oxide film is formed by oxidizing part of the surface of the substrate 11 which is not covered with the $SiO_2$ film 12, and a polycrystalline silicon layer 14 with a thickness of about 3,000 Å is formed over the whole surface of the $SiO_2$ film 13 by the chemical vapor deposition method, for example. Then, as shown in FIG. 2c, a laser light 30 is applied to the whole surface of the polycrystalline silicon layer 14. The laser light 30 used may, for example, be a pulse laser light with a pulse width of 20 to 200 nsec and a frequency of 5 to 30 kHz. In this process, the laser light 30 emitted from e.g. an Nd-YAG laser 41 with the maximum output power of 10 W, as shown in FIG. 3, is refracted at an angle of 90° by a reflector 43 through a first lens 42, narrowed down to approximately 40 to 80 μm in beam diameter by means of a second lens 44, and applied to a wafer 46 placed on a stage 45. The whole surface of the wafer 46 with the polycrystalline silicon layer formed thereon may be irradiated by scanning the stage 45 in both X and Y directions.

Figure 2D:
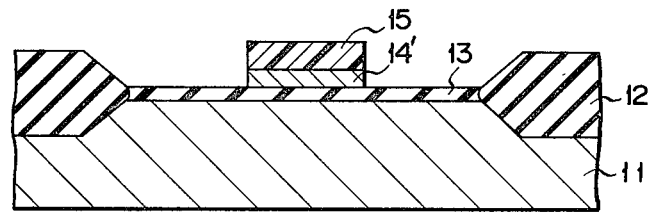

After thus applying the laser light 30 to the polycrystalline silicon layer, a photo-resist film 15 is formed selectively on the polycrystalline silicon layer 14 in the same manner as the conventional process, as shown in FIG. 2d, the polycrystalline silicon layer 14 is plasma-etched for patterning by using e.g. freon plasma, and part of the polycrystalline silicon layer 14 is left to form a gate electrode. Since the polycrystalline silicon layer 14 is subjected to the laser light and is flattened and homogenized prior to the patterning process, desired high-accuracy patterning may be achieved without partially leaving or over-etching the polycrystalline silicon layer 14.

Figure 2E:
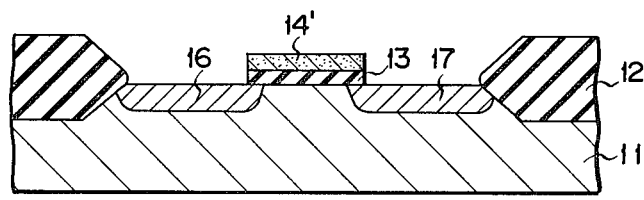

Subsequently, as shown in FIG. 2e, n-type source and drain regions 16 and 17 are formed by removing portions of the 700 Å $SiO_2$ film 13 to form the source and drain regions, also removing the photo-resist film 15, and diffusing phosphorus from e.g. $POCl_3$ as a diffusion source at approximately 1,000° C. for about 10 minutes. Usually at diffusion, phosphorus is diffused also into the polycrystalline silicon layer 14' to reduce its resistance value to about 20Ω/□. According to the method of this invention, however, the laser light 30 is previously applied to the polycrystalline silicon layer 14' to improve the crystallinity thereof and double the electron mobility, so that the resistance value of the layer 14' is substantially halved or becomes approximately 10Ω/□ to provide facility for the use of the layer as the electrode. Moreover, since the polycrystalline silicon layer 14 is homogenized by the irradiation as aforesaid, phosphorus will never be diffused into the Si substrate 11 through the polycrystalline silicon layer 14' and the $SiO_2$ film 13 forming the gate oxide film during the diffusion and heat treatment thereafter.

Figure 2F:
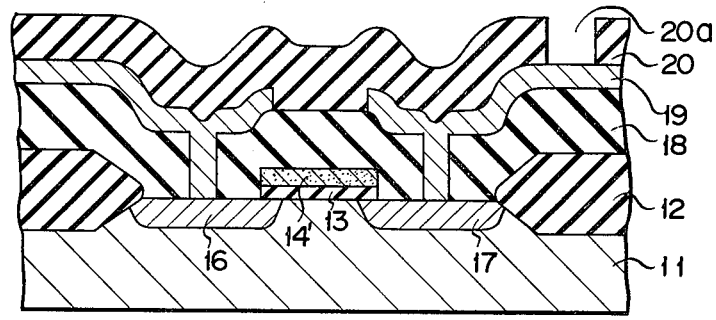

Then, as shown in FIG. 2f, a relatively thick or e.g. about 1 μm third insulating film, such as an $SiO_2$ film 18, is formed all over the surface by the chemical vapor deposition method, contact holes for electrical contact are made in the $SiO_2$ film 18 in the same manner as the conventional method, an aluminium layer 19 is selectively formed, e.g. a PSG (phosphor-Silicate Glass) film 20 is formed on the Al layer 19, and finally bonding pad opening or through hole for another contact 20a is made in the PSG film 20.

In the method for manufacturing the semiconductor device according to this invention, as described above in detail, the process for applying the laser light or electron beam to the polycrystalline layer is provided before the patterning process, thereby preventing the uneven over-etching and abnormal diffusion of impurity into the surface of the semiconductor substrate that are liable to be caused in the manufacturing processes for this type of semiconductor device, and facilitating desired patterning. If the polycrystalline silicon layer is 3 μm wide, for example, defectives attributable to the patterning of the polycrystalline silicon layer may be reduced to approximately 1/10 or less, and defectives due to the diffusion of impurity into the semiconductor substrate may be reduced to approximately 1/5 or less. Further, the resistance of the polycrystalline silicon layer becomes approximately 10Ω/□ substantially equivalent to the half of the value obtained before the application of the laser light or electron beam, which is suited to the use for the gate electrode.

Figure 1A:
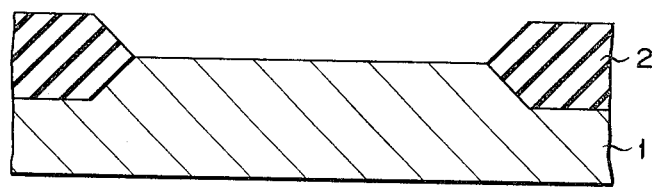
FIGS. 1a to 1e are sectional views for illustrating processes of a prior art method for manufacturing an n-channel MOS FET.
Figure 1B:
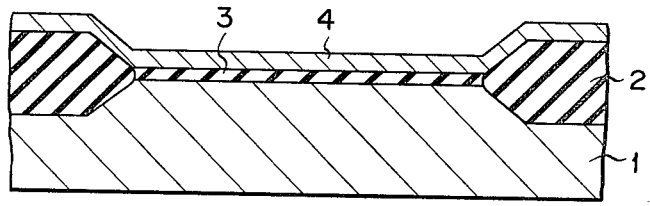
Figure 1C:
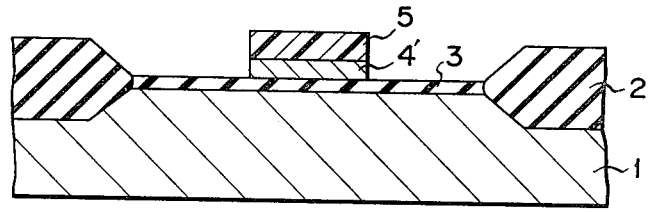
Figure 1D:
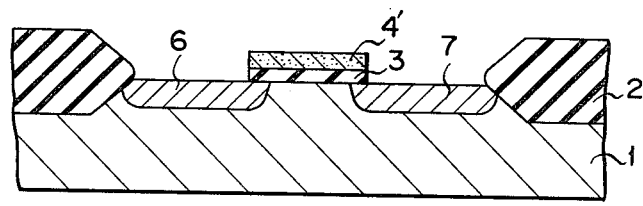
Figure 1E:
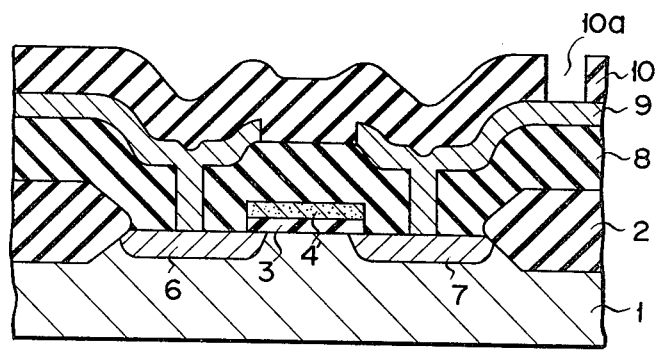
Figure 4A:
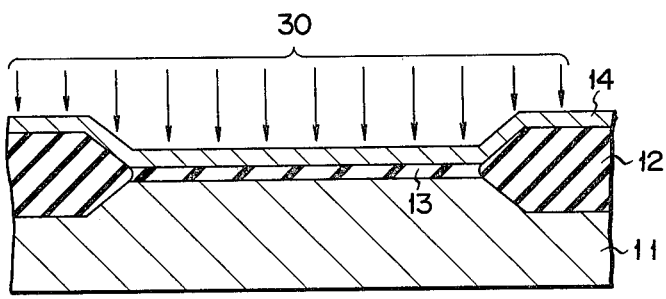
FIGS. 4a to 4c and 5a to 5c are sectional views for severally illustrating part of processes of method for manufacturing n-channel MOS FET's according to alternative embodiments of the invention.
Figure 4B:
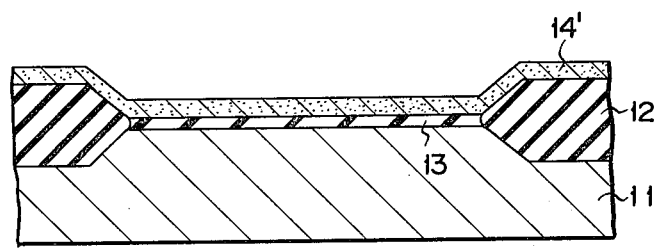

Referring now to the drawings of FIG. 4, there will be described another embodiment of this invention. For the ease of explanation, like reference numerals refer to the same parts as shown in FIG. 2. A process shown in FIG. 4a is just the same as the one shown in FIG. 2c, and processes preceding such process are the same as the ones shown in FIGS. 1a and 1b, so that the description of these processes is omitted herein. After the laser light 30 is applied to the polycrystalline silicon layer 14, as shown in FIG. 4a, e.g. phosphorus from POCl₃ as a diffusion source is diffused into the layer 14 at 1,000° C. for about 10 minutes to provide the polycrystalline silicon layer 14', as shown in FIG. 4b. The polycrystalline silicon layer 14' thus subjected to the diffusion of phosphorus, having a relatively low resistance as aforesaid, can be used as the gate electrode. Moreover, since the laser light is previously applied to the polycrystalline silicon layer 14' before the impurity diffusion, the impurity will hardly be introduced into the surface of the Si substrate 11 through the polycrystalline silicon layer 14' and the SiO₂ film 13 in the course of the diffusion and heat treatment thereafter. The reason for this is that the grains of the polycrystalline silicon layer become larger during the irradiation substantially to remove the boundaries among the grains, so that the impurity is substantially prohibited from penetrating through such boundaries.

Figure 4C:
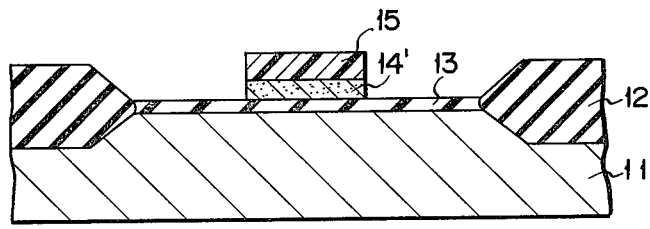

Thereafter, as shown in FIG. 4c, the photo-resist film 15 is formed selectively on the polycrystalline silicon layer 14' doped with phosphorus, and the impurity-doped polycrystalline silicon layer 14' is plasma-etched for patterning by using e.g. freon plasma, thereby leaving part of the polycrystalline silicon layer 14' to form the gate electrode. Since the laser light is previously applied to the polycrystalline silicon layer 14' before the patterning process, high-accuracy optional patterning may be achieved without partially leaving or over-etching the polycrystalline silicon layer 14'.

Then, n-type source and drain regions are formed by removing portions of the 700 Å SiO₂ film 13 to form the source and drain regions, also removing the photo-resist film 15, implanting e.g. 150 kev As ion at a rate of approximately $1 \times 10^{16}$/cm², and annealing the resultant structure in an N₂ atmosphere at approximately 1,000° C. for about one hour. Thereafter, following the processes of FIGS. 2e and 2f, the n-channel MOS FET as shown in FIG. 2f is obtained.

Figure 5A:
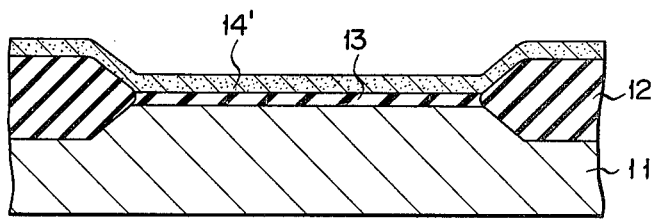
Figure 5B:
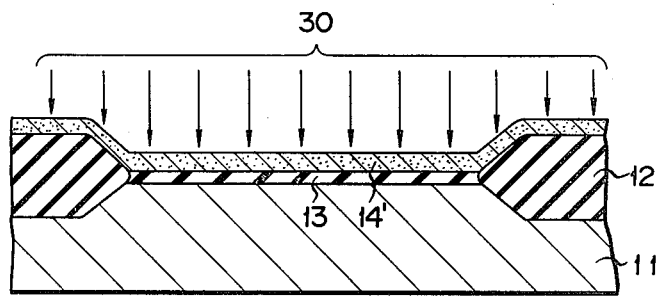
Figure 5C:
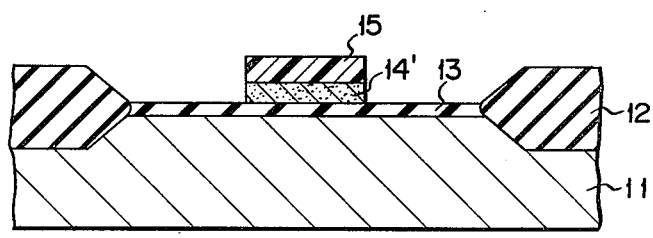

Referring now to the drawings of FIG. 5, there will be described still another embodiment of this invention. Processes shown in FIG. 5 differs from the ones shown in FIG. 4 only in the order of the process for applying the laser light to the polycrystalline silicon layer. That is, whereas, in the processes of FIG. 4, the laser light is applied before the polycrystalline silicon layer is doped with impurity, the laser light is applied as shown in FIG. 5b after the doping operation as shown in FIG. 5a, in the processes shown in FIG. 5. The remaining processes before the process of FIG. 5a and after the process of FIG. 5c, as well as the functions and effects thereof, are just the same as ones corresponding to FIG. 4, so that the detailed description of such processes is omitted herein.

Although a p-type Si substrate is used for the above-mentioned embodiments of the invention, it may be replaced by an n-type substrate, provided boron is used for the impurity to be diffused into the source and drain region. The impurity doping to the polycrystalline silicon is not limited by phosphorus, but can be done by at least one kind of impurities including P (phosphorus), As, B, Al, Ge, Sn, Sb, O, N, or H.

Further, although there has been described a method for manufacturing an n-channel MOS FET in connection with the above-mentioned embodiments, the method of the invention may be applied to a CMOS or bipolar transistor.

It is obviously understood that this invention may be also effected in an electrical conducting portion such as a polycrystalline silicon wire itself, or polycrystalline silicon electrode and its wire.

Moreover, although the impurity is introduced into the whole surface of the polycrystalline silicon layer in the above embodiments, such introduction may be partially done by applying higher energy density laser light to an electrically conductive portion to form the gate electrode and/or wire, taking advantage of a reduction of etching speed caused by the irradiation, for example.

Furthermore, although there has been described the pulse application of laser light for the irradiation process according to the above-mentioned embodiments of the invention, a CW laser light can be applied in concurrence with scanning at a speed of 20 cm/s, or otherwise, the substrate may be heated to approximately 100° to 500° C. at the irradiation. Naturally, according to this invention, the laser light for the irradiation may be replaced by any other energy source having equivalent functions and effects, such as electron beam.

It is to be understood that this invention is not limited to the aforementioned precise embodiments, and that various changes and modifications may be effected therein by one skilled in the art without departing from the scope or spirit of the invention.

What we claim is:

1. A method for manufacturing a semiconductor device, comprising:
   a process for forming an insulating film at least on part of the surface of a semiconductor;
   a process for forming a polycyrstalline silicon layer on said insulating film;
   a process for forming an electrically conductive portion by patterning of said polycrystalline silicon layer; and
   a process for forming other insulating film covering at least said electrically conductive portion;
   said method characterized by further comprising a process for flattening and homogenizing at least a part of said polycyrstalline silicon layer by applying a laser light or electron beam to said at least a part of said polycyrstalline silicon layer which is to be formed as said electrically conductive portion, prior to the patterning process.

2. A method for manufacturing a semiconductor device according to claim 1 characterized in that said polycrystalline silicon layer forming said electrically conductive portion is patterned after the laser light or electron beam is applied at least to part thereof, and thereafter at least part of said polycrystalline silicon layer is doped with impurity.

3. A method for manufacturing a semiconductor device according to claim 1 characterized in that at least part of said polycrystalline silicon layer forming said electrically conductive portion is doped with impurity after the laser light or electron beam is applied at least to part of said layer, and thereafter said polycrystalline silicon layer is patterned.

4. A method for manufacturing a semiconductor deive according to claim 1 characterized in that the laser light or electron beam is applied at least to part of said polycrystalline silicon layer forming said electrically conductive portion after at least part of said layer is doped with impurity, and thereafter said polycrystalline silicon layer is patterned.

5. A method for manufacturing a semiconductor device according to claim 1 characterized in that said semiconductor substrate is a p- or n-type silicon substrate and that said first insulating films are $SiO_2$ films.

6. A method for manufacturing a semiconductor device according to claim 1 characterized in that said polycrystalline silicon layer is doped with at least one kind of impurities including P, As, B, Al, Ge, Sn, Sb, N, O, or H.

* * * * *